US012680644B2

(12) United States Patent
Li

(10) Patent No.: US 12,680,644 B2
(45) Date of Patent: Jul. 14, 2026

(54) BLIND-MATE CONNECTOR AND LIQUID COOLING APPARATUS

(71) Applicant: Huawei Technologies Co., Ltd., Shenzhen (CN)

(72) Inventor: Dingfang Li, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 19/027,498

(22) Filed: Jan. 17, 2025

(65) Prior Publication Data

US 2025/0164053 A1 May 22, 2025

Related U.S. Application Data

(63) Continuation of application No. PCT/CN2023/093298, filed on May 10, 2023.

(30) Foreign Application Priority Data

Aug. 5, 2022 (CN) ......................... 202222067941.X

(51) Int. Cl.
*F16L 37/56* (2006.01)
*H05K 7/20* (2006.01)

(52) U.S. Cl.
CPC .......... *F16L 37/56* (2013.01); *H05K 7/20272* (2013.01); *H05K 7/20781* (2013.01)

(58) Field of Classification Search
CPC ......................... F16L 37/56; Y10T 137/87153
See application file for complete search history.

(56) References Cited

U.S. PATENT DOCUMENTS

2013/0134702 A1* 5/2013 Boraas ................... F16L 37/23
285/120.1

FOREIGN PATENT DOCUMENTS

| | | |
|---|---|---|
| CN | 110829091 A | 2/2020 |
| CN | 112020264 A | 12/2020 |
| CN | 212080463 U | 12/2020 |
| CN | 215816559 U | 2/2022 |
| CN | 215908622 U | 2/2022 |
| CN | 218677782 U | 3/2023 |
| DE | 3842500 A1 * | 6/1990 |

(Continued)

OTHER PUBLICATIONS

Yang, Ming-Tang, CN-113631012-A, Nov. 9, 2021.*

(Continued)

*Primary Examiner* — Matthew Troutman
*Assistant Examiner* — James A Linford
(74) *Attorney, Agent, or Firm* — Slater Matsil, LLP

(57) ABSTRACT

A blind-mate connector includes a floating support, a connector, and a floating component. The connector includes a plug-in end, and the plug-in end is configured to be inserted into the to-be-cooled device. The connector is slidably assembled on the floating support, and a sliding direction of the connector is consistent with an insertion direction of the connector. The blind-mate connector is floatable in the insertion direction. The floating support is mounted on a fixing plate by using the floating component. The floating component includes a protrusion and a floating hole. A diameter of the floating hole is larger than that of the protrusion. The protrusion is assembled in the floating hole, and the protrusion is circumferentially movable in the floating hole.

20 Claims, 3 Drawing Sheets

100

(56)                    References Cited

FOREIGN PATENT DOCUMENTS

DE      102016005300  A1  *  11/2017
GB           968522  A   *   9/1964

OTHER PUBLICATIONS

Sun, Tian-ma, CN-118632475-A, Sep. 10, 2024.*
Wu, Lei, CN-120049231-A, May 27, 2025.*
Cui Yan, EP-3364736-A1, Aug. 22, 2018.*
Katsuya Yoshio, JP-2003035389-A, Feb. 7, 2003.*

* cited by examiner

BLIND-MATE CONNECTOR AND LIQUID COOLING APPARATUS

CROSS-REFERENCE TO RELATED APPLICATIONS

This application is a continuation of International Application No. PCT/CN2023/093298, filed on May 10, 2023, which claims priority to Chinese Patent Application No. 202222067941.X, filed on Aug. 5, 2022. The disclosures of the aforementioned applications are hereby incorporated by reference in their entireties.

TECHNICAL FIELD

This application relates to the field of electronic device technologies, and in particular, to a blind-mate connector and a liquid cooling apparatus.

BACKGROUND

With the advent of the artificial intelligence era, power consumption of a chip increases faster with improvement of a capability of the chip, which imposes a higher requirement on a heat dissipation capability of the chip. Because a liquid cooling technology has a good heat dissipation effect, the liquid cooling technology is more widely applied as an important means for heat dissipation of the chip. However, for a server and a memory with a large volume, an external liquid cooling frame is usually needed to implement liquid cooling for heat dissipation.

Specifically, the server, the memory, and the like are usually disposed in a cabinet, and the liquid cooling frame needs to be connected to the cabinet by using a connector. In the conventional technology, two types of connectors: a hand-mate connector and a blind-mate connector are commonly used. The hand-mate connector has more wirings and pipe connections and is complex to maintain. Because a cumulative tolerance of cabinet-level connections is large, direct plug-in of the blind-mate connector may cause poor assembly of the connector. Therefore, a floating blind-mate connector needs to be designed. Currently, an existing blind-mate connector solution has many parts and is complex to assemble.

SUMMARY

This application provides a blind-mate connector and a liquid cooling apparatus, so that the blind-mate connector can be mounted in a floating manner, and the blind-mate connector has a simple structure.

According to a first aspect, this application provides a blind-mate connector. The blind-mate connector is configured to be inserted into a to-be-cooled device. The blind-mate connector includes a floating support, a connector, and a floating component. The connector includes a plug-in end, and the plug-in end is specifically configured to be inserted into the to-be-cooled device, to implement a connection between a liquid cooling apparatus and a to-be-cooled structure. The connector is slidably assembled on the floating support, and a sliding direction of the connector is consistent with an insertion direction of the connector. Therefore, the blind-mate connector in this solution is floatable in the insertion direction, to absorb a tolerance of the to-be-cooled device in the insertion direction and a tolerance between the blind-mate connector and the to-be-cooled device. The floating support is mounted on a fixing plate by using the floating component. The floating component includes a protrusion and a floating hole. A diameter of the floating hole is larger than that of the protrusion. The protrusion is assembled in the floating hole, and the protrusion is circumferentially movable in the floating hole. In this solution, the floating support is circumferentially floatable relative to the fixing plate, that is, the floating support is floatable relative to the fixing plate in a plane perpendicular to the insertion direction, to absorb a tolerance of the to-be-cooled device in the plane perpendicular to the insertion direction and the tolerance between the blind-mate connector and the to-be-cooled device. Specifically, the protrusion may be located on the fixing plate, and the floating hole is located on the floating support; or the protrusion may be located on the floating support, and the floating hole is located on the fixing plate. The blind-mate connector in this solution is floatable in various directions and has a simple structure.

The blind-mate connector may further include an elastic member. The elastic member is mounted between the connector and the floating support, and is configured to apply a reset force toward the to-be-cooled device in the insertion direction to the plug-in end. The elastic member in this solution can ensure reliability of a connection between the plug-in end of the connector and the to-be-cooled device, and avoid a leakage problem.

The floating component may further include a screw, a thickness of the floating hole is smaller than a thickness of the protrusion, the protrusion has a screw hole, and the screw is mounted in the screw hole, so that the protrusion is located in the floating hole. A mounting mode of the screw is used to facilitate mounting and removal, and a structure is simple and easy to manufacture.

The blind-mate connector further includes an auxiliary plate. When the protrusion is located on the floating support and the floating hole is located on the fixing plate, the auxiliary plate is located on a side of the fixing plate away from the floating support, the auxiliary plate includes a first mounting hole, and the screw passes through the first mounting hole to fasten the auxiliary plate and the floating support. In this technical solution, the fixing plate is located between the auxiliary plate and the floating support, and this helps improve structural reliability of mounting the floating support.

In another technical solution, when the blind-mate connector includes an auxiliary plate, the floating support may further include a connecting plate, the floating hole is located on the connecting plate, and the protrusion is located on the fixing plate. The auxiliary plate is located on a side of the connecting plate away from the fixing plate, the auxiliary plate includes a second mounting hole, and the screw passes through the second mounting hole to fasten the auxiliary plate and the fixing plate. In this technical solution, the connecting plate of the floating support is located between the auxiliary plate and the fixing plate, and this can also improve structural reliability of mounting the floating support.

To mount the connector, the floating support further includes an accommodating cavity. The connector is at least partially located in the accommodating cavity, the accommodating cavity includes a bottom wall and a side wall, and the elastic member is mounted between the bottom wall and the plug-in end. In this solution, the accommodating cavity may protect the plug-in end, and is configured to accommodate an accessory such as the elastic member, to improve convenience of mounting and using the blind-mate connector.

In a further technical solution, the side wall includes a limiting step, and the connector has a first surface matching the limiting step. When the connector moves toward the bottom wall by a first preset distance, the first surface abuts against the step. The first preset distance determines a floating distance of the blind-mate connector in the insertion direction.

A stopper is detachably mounted on an opening part of the accommodating cavity, the connector has a second surface matching the stopper, and the second surface can abut against the stopper. The stopper may enable a partial structure of the connector to be reliably accommodated in the accommodating cavity without falling off, and has a simple structure.

In an optional technical solution, a difference between the diameter of the floating hole and the diameter of the protrusion is less than or equal to 5 mm. Therefore, a floating distance of the blind-mate connector in a circumferential direction does not exceed 5 mm, and this can meet a tolerance requirement. In addition, if the diameter of the floating hole differs greatly from the diameter of the protrusion, it is difficult to align the blind-mate connector with the to-be-cooled device, and an operation is complex.

In addition, a sliding stroke of the connector relative to the floating support is less than or equal to 5 mm. Therefore, the floating distance of the blind-mate connector in the insertion direction does not exceed 5 mm, and this can meet the tolerance requirement. In addition, if the sliding stroke is excessively long, reliability of the connection between the connector and the to-be-cooled device cannot be ensured, and leakage is easily caused.

To improve connection efficiency of the blind-mate connector, the blind-mate connector includes at least two connectors, so that connections of the at least two connectors can be implemented in one plug-in operation.

According to a second aspect, this application further provides a liquid cooling apparatus, including the blind-mate connector in the first aspect, and further including a liquid storage cavity and a pipe. One end of the pipe is in communication with the liquid storage cavity, and the other end is in communication with the blind-mate connector, to implement a connection between the blind-mate connector and the liquid storage cavity.

REFERENCE NUMERALS

100—Blind-mate connector,
200—Liquid storage cavity;
300—Pipe;
1—Floating support;

11—Accommodating cavity;
111—Bottom wall;
112—Side wall;
1121—Limiting step;
12—Stopper;
2—Connector;
21—Plug—in end;
22—First surface;
23—Second surface;
3—Elastic member;
4—Fixing plate;
5—Floating component;
51—Floating hole;
52—Protrusion;
53—Screw;
6—Auxiliary plate;
61—First plate; and
62—Second plate.

DETAILED DESCRIPTION OF ILLUSTRATIVE EMBODIMENTS

To make the objectives, technical solutions and advantages of this application clearer, this application is further described below in detail with reference to the accompanying drawings.

Terms used in the following embodiments are merely intended to describe specific embodiments, but are not intended to limit this application. As used in the specification and the appended claims of this application, the singular expressions "a/an", "one", "said", "the above", "the", and "this" are intended to also include such expressions as "one or more", unless otherwise clearly indicated in the context.

Reference to "an embodiment", "a specific embodiment", or the like described in the specification means that one or more embodiments of this application include a specific feature, structure, or characteristic described with reference to this embodiment. The terms "include", "comprise", "have", and variations thereof all mean "including but not limited to", unless otherwise particularly specified.

To facilitate understanding of a blind-mate connector and a liquid cooling apparatus provided in embodiments of this application, an application scenario of the blind-mate connector and the liquid cooling apparatus is first described below. A liquid cooling technology is a commonly used heat dissipation method currently, and provides a good heat dissipation capability. For a cabinet-level electronic device such as a server and a memory that are disposed in a cabinet, an external liquid cooling apparatus is usually used to dissipate heat for an electronic component, to ensure a heat dissipation capability of the electronic component and improve a service life of the electronic component. In a specific embodiment, the liquid cooling apparatus may also be referred to as a liquid cooling frame or a liquid cooling system. A refrigerant liquid needs to be transferred between the liquid cooling apparatus and the cabinet. Therefore, a connector may be used to connect a liquid flow port of the liquid cooling apparatus to a liquid flow port of the cabinet. To simplify the operation, a blind-mate connector may be used to implement the foregoing connection. Because a cumulative tolerance of the connection between the cabinet where the device is placed and a liquid cooling cabinet is large, direct plug-in of the blind-mate connector may cause poor assembly of the connector. Therefore, a floating blind-mate connector needs to be designed. Currently, an existing blind-mate connector solution has many parts and is complex to assemble.

Figure 1:
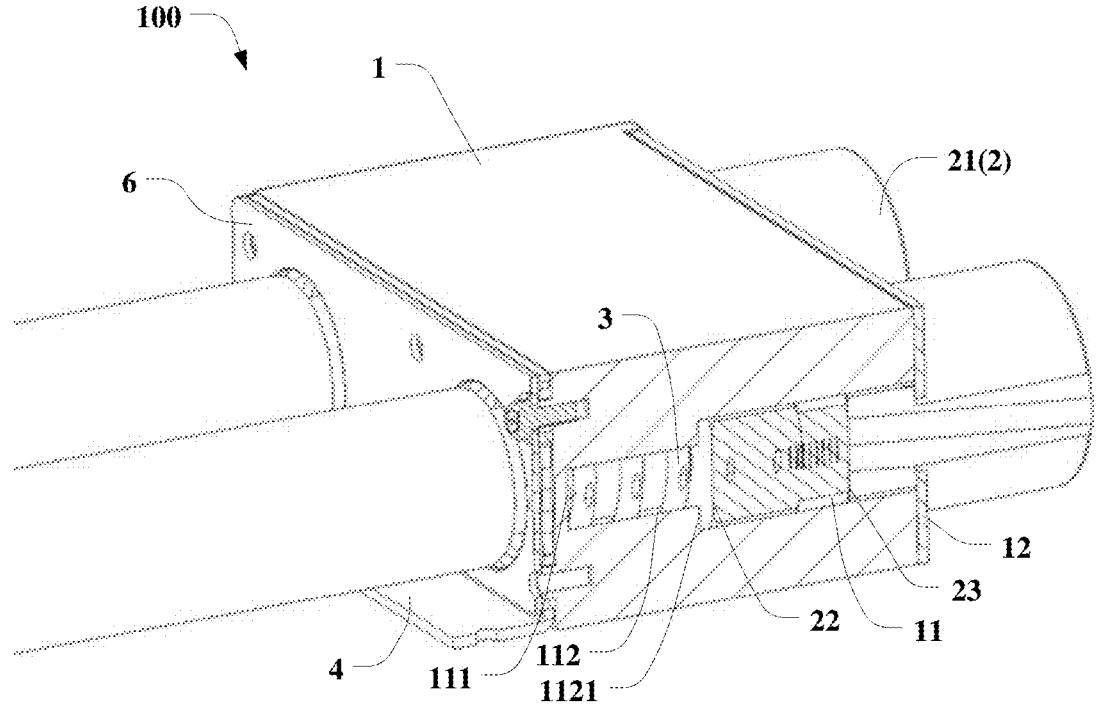
FIG. 1 is a diagram of a structure of a blind-mate connector according to an embodiment of this application.

FIG. 1 is a diagram of a structure of a blind-mate connector according to this application. FIG. 1 shows a cross-sectional structure of the blind-mate connector 100. As shown in FIG. 1, the blind-mate connector 100 in this embodiment of this application includes a floating support 1, a connector 2, and a floating component 5. The floating support 1 serves as a support of the blind-mate connector 100, and the connector 2 floats relative to the floating support 1, so that the floating blind-mate connector 100 can be formed. The connector 2 includes a plug-in end 21. The plug-in end 21 is configured to be connected to a to-be-cooled device. The to-be-cooled device may be specifically a server cabinet, a memory cabinet, an electronic device in a cabinet, or a component of an electronic device. The connector 2 is slidably assembled on the floating support 1, and a sliding direction of the connector 2 is consistent with an insertion direction of the connector 2. In other words, the connector 2 is slidably assembled on the floating support 1 in an insertion direction. In this case, when the blind-mate connector 100 is inserted into the to-be-cooled device, if the insertion is not in alignment, the plug-in end 21 of the connector 2 may be abutted in a direction away from the to-be-cooled device. In this way, the blind-mate connector 100 can float in the insertion direction.

The blind-mate connector may further include an elastic member 3. The elastic member 3 is mounted between the connector 2 and the floating support 1, and applies a reset force to the plug-in end 21 toward the to-be-cooled device in the insertion direction. In this case, when the blind-mate connector boo is inserted into the to-be-cooled device, the elastic member 3 may enable the connector 2 to abut against the to-be-cooled device, to ensure that the plug-in end 21 is reliably connected to the to-be-cooled device.

Still refer to FIG. 1. The floating support 1 includes an accommodating cavity 11, and the connector 2 is at least partially located in the accommodating cavity 11. The accommodating cavity 11 includes a bottom wall 111 and a side wall 112, and the elastic member 3 is mounted between the bottom wall 111 and the plug-in end 21. In this solution, the plug-in end 21 of the connector 2 is slidable in the accommodating cavity 11 in the insertion direction. The accommodating cavity 11 in this solution may further protect the plug-in end 21, and is configured to accommodate an accessory such as the elastic member 3, to improve convenience of mounting and using the blind-mate connector 100.

In a specific embodiment, that the elastic member 3 is mounted between the bottom wall 111 and the plug-in end 21 means that the elastic member 3 is located on a side of the plug-in end 21 facing the bottom wall 111. Specifically, when the elastic member 3 is mounted, one end of the elastic member 3 may be connected to the plug-in end 21 of the connector 2, and the other end may be connected to the bottom wall 111 of the accommodating cavity 11. Alternatively, in another embodiment, one end of the elastic member 3 may be connected to the plug-in end 21 of the connector 2, and the other end may be connected to the side wall 112 of the accommodating cavity 1. That is, the elastic member 3 has to be located on the side of the plug-in end 21 facing the bottom wall 111. The elastic member 3 may be specifically a linear spring having a simple structure and low costs.

Still refer to FIG. 1. The side wall 112 may further include a limiting step 1121, and the connector 2 has a first surface 22 matching the limiting step 1121. When the blind-mate connector 100 is in an unused state, the limiting step 1121 is spaced by a first preset distance from the first surface 22 in the insertion direction. In this case, when the connector 2 moves toward the bottom wall 111 by the first preset distance, the first surface 22 abuts against the step. In this solution, the plug-in end 21 may be limited, to prevent the plug-in end 21 from being excessively retracted into the accommodating cavity 11. The first preset distance may be specifically determined based on a mounting tolerance of the to-be-cooled device in the insertion direction and a mounting tolerance of the blind-mate connector in the insertion direction. It may be considered that the first preset distance determines a floating distance of the blind-mate connector in the insertion direction.

In addition, to ensure that an insertion part of the connector 2 can be more reliably located in the accommodating cavity 11 of the floating support 1, a stopper 12 is detachably mounted on an opening of the accommodating cavity 11. The connector 2 has a second surface 23 matching the stopper 12, and the second surface 23 can abut against the stopper 12. In this solution, the stopper 12 may limit the plug-in end 21 on another side, so that the plug-in end is reliably disposed on the floating support 1.

In a specific embodiment, a sliding stroke of the connector 2 relative to the floating support 1 may be determined based on the mounting tolerance of the to-be-cooled device in the insertion direction and the mounting tolerance of the blind-mate connector in the insertion direction. Specifically, the sliding stroke of the connector 2 relative to the floating support 1 may be less than or equal to 5 mm. Specifically, the first preset distance may be less than or equal to 5 mm, or a distance between the limiting step 1121 and the stopper 12 may be less than or equal to 5 mm. For example, the sliding stroke of the connector 2 relative to the floating support 1 may be 0.5 mm, 1 mm, 1.2 mm, 1.5 mm, 1.8 mm, 2 mm, 2.5 mm, 3 mm, 3.3 mm, 3.5 mm, 3.7 mm, 4 mm, 4.5 mm, 4.9 mm, or the like. A specific value of the sliding stroke is not limited in this application. If the sliding stroke is less than or equal to 5 mm, a blind-mate requirement can be ensured. If the sliding stroke is excessively long, reliability of a connection between the connector and the to-be-cooled device cannot be ensured, and leakage is easily caused.

Figure 2:
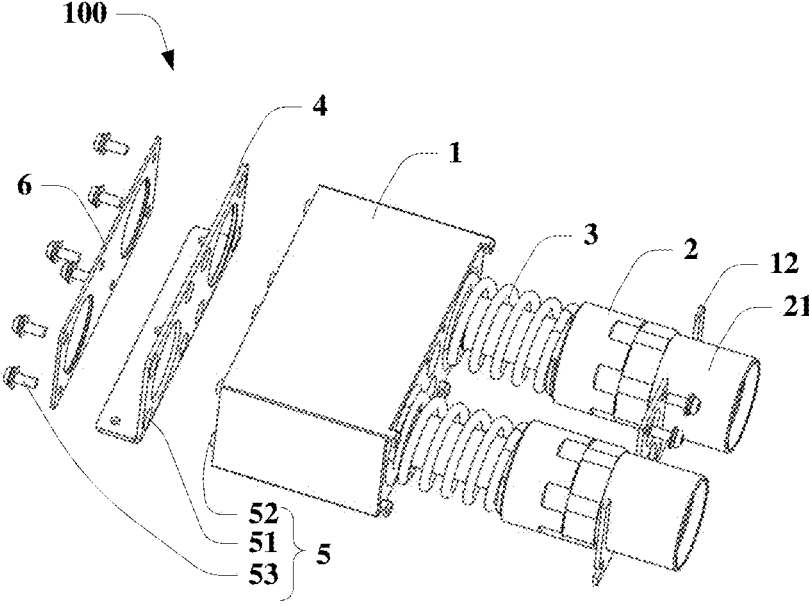
FIG. 2 is a diagram of an exploded structure of a blind-mate connector according to an embodiment of this application.

FIG. 2 is a diagram of an exploded structure of a blind-mate connector according to an embodiment of this application. As shown in FIG. 2, the blind-mate connector 100 further includes a fixing plate 4. The fixing plate 4 is configured to be mounted on a base, so that the entire blind-mate connector 100 is mounted on the base. A floating support 1 is mounted on the fixing plate 4 by using a floating component 5. Specifically, the floating component 5 includes a protrusion 52 and a floating hole 51. A diameter of the floating hole 51 is larger than that of the protrusion 52. The protrusion 52 extends into the floating hole 51, so that the protrusion 52 is assembled in the floating hole 51. In this case, the protrusion 52 can circumferentially move in the floating hole 51, so that the protrusion 52 is assembled relative to the floating hole 51 in a circumferentially floating manner. In a specific embodiment, the protrusion 52 is located on the fixing plate 4, and the floating hole 51 is located on the floating support 1, so that the floating support 1 and the fixing plate 4 may be assembled in a circumferentially floating manner. Alternatively, in another embodiment, the protrusion 52 may be located on the floating support 1, and the floating hole 51 may be located on the fixing plate 4, so that the floating support 1 and the fixing plate 4 may also be assembled in a circumferentially floating manner. In this case, when the blind-mate connector 100 is inserted into the to-be-cooled device, if the circumferential insertion is not in alignment, the connector 2 may be circumferentially shaken in a specific range, to ensure that the plug-in end 21 is reliably connected to the to-be-cooled device. In this way, the blind-mate connector 100 can circumferentially float. Therefore, the blind-mate connector 100 in this embodiment of this application can implement all-round floating in an axial direction and a circumferential direction, so that an insertion process is simplified. In addition, the blind-mate connector 100 in this embodiment of this application has a simple structure, and an assembly process is also simple. For example, in the blind-mate connector in the embodiment shown in FIG. 2, in addition to the connector, the blind-mate connector includes 14 parts, including four mechanical parts, eight fasteners (screws), and two springs (reset parts).

Figure 3:
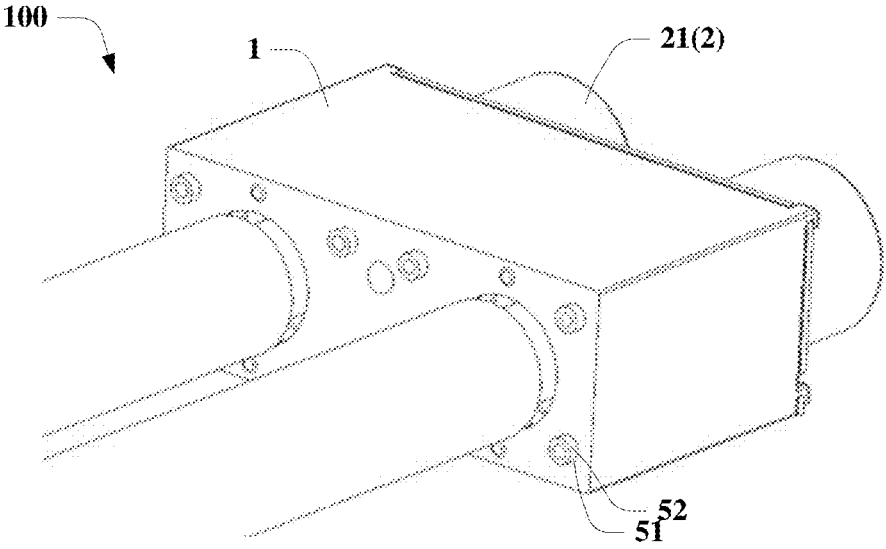
FIG. 3 is a diagram of a partial structure of a blind-mate connector according to an embodiment of this application.
Figure 4:
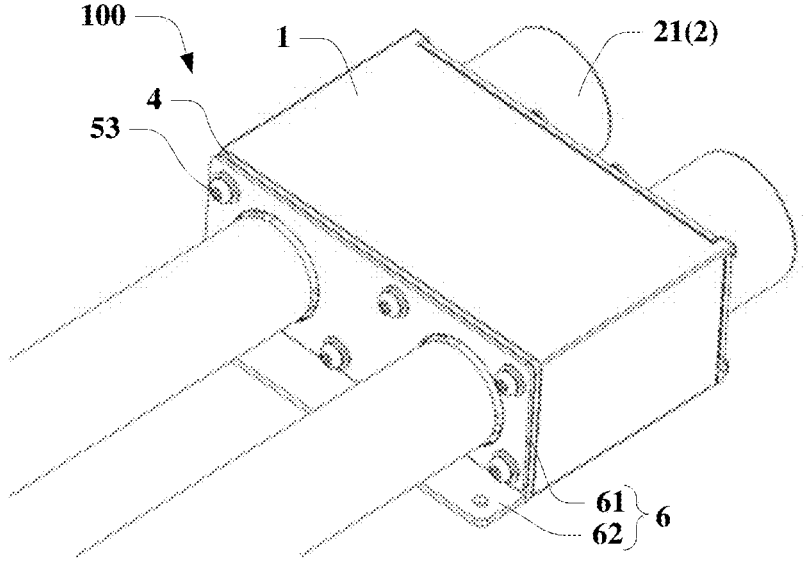
FIG. 4 is a diagram of a structure of a blind-mate connector according to an embodiment of this application.

FIG. 3 is a diagram of a partial structure of a blind-mate connector according to an embodiment of this application. FIG. 4 is a diagram of a structure of a blind-mate connector according to an embodiment of this application. As shown in FIG. 3 and FIG. 4, in a specific embodiment, a floating component 5 may further include a screw 53. A thickness of a floating hole 51 is smaller than a thickness of a protrusion 52, and the thickness may be specifically a size in an extension direction of the protrusion 52, or a size in an insertion direction of the blind-mate connector 100. After extending into the floating hole 51, the protrusion 52 can extend by a specific size at another end of the floating hole 51. The protrusion 52 has a screw 53 hole, and a screw 53 is mounted in the screw 53 hole, so that the protrusion 52 is located in the floating hole 51 without falling off, in other words, the protrusion 52 is fixed into the floating hole 51 in an axial direction. Clearly, to ensure that the protrusion 52 can circumferentially shake relative to the floating hole 51, the protrusion 52 may not be tightly engaged with the floating hole 51 in the axial direction, to avoid that the protrusion 52 cannot shake relative to the floating hole 51 due to a large friction force.

Figure 5:
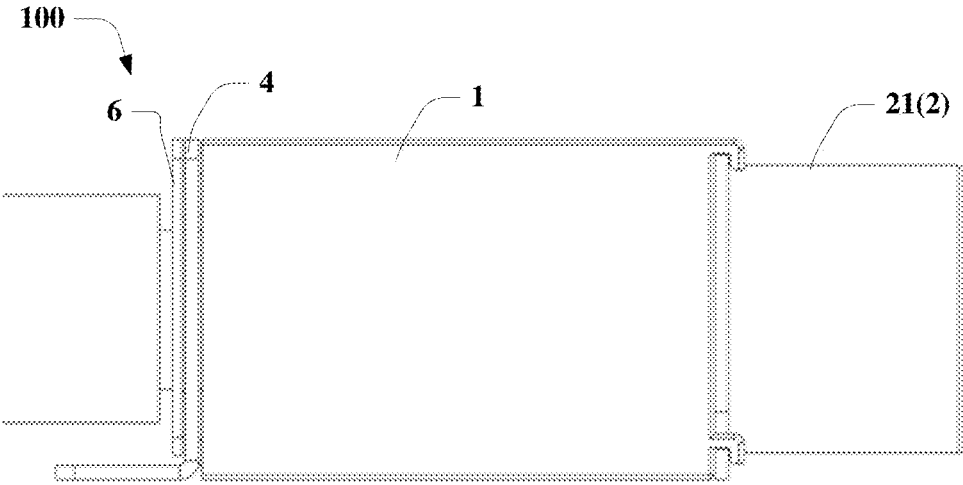
FIG. 5 is a diagram of a lateral structure of a blind-mate connector according to an embodiment of this application.

FIG. 5 is a diagram of a lateral structure of a blind-mate connector according to an embodiment of this application. With reference to FIG. 2, FIG. 4, and FIG. 5, in an embodiment, the blind-mate connector 100 further includes an auxiliary plate 6. A protrusion 52 is located on a floating support 1, and a floating hole 51 is located on a fixing plate 4. The auxiliary plate 6 is located on a side of the fixing plate 4 away from the floating support 1. The auxiliary plate 6 includes a first mounting hole, and a screw 53 passes through the first mounting hole to fasten the auxiliary plate 6 and the floating support 1. In this solution, the auxiliary plate 6 is fastened to the floating support 1, and the fixing plate 4 is located between the auxiliary plate 6 and the floating support 1. The auxiliary plate 6 and the floating support 1 simultaneously circumferentially shake relative to the fixing plate 4, and this helps improve reliability of circumferentially floating the floating support 1, and makes a fastened connection between the floating support 1 and the fixing plate 4 reliable in an axial direction.

Still refer to FIG. 5. In a specific embodiment, the auxiliary plate 6 is fastened to the fixing plate 4 with a gap therebetween, so that the floating support 1 circumferentially floats relative to the fixing plate.

Specifically, during configuration of the fixing plate, the fixing plate may include a first plate 61 and a second plate 62, and the first plate 61 and the second plate 62 may be specifically vertically disposed. Herein, that the first plate 61 and the second plate 62 are vertically disposed means that the first plate 61 is approximately perpendicular to the second plate 62. For example, an included angle between the first plate 61 and the second plate 62 may be 88° to 92°. For example, an included angle between the first plate 61 and the second plate 62 may be 89°, 89.5°, 90°, 90.5°, or 91°. The first plate 61 is configured to mount the floating support 1, and the second plate 62 is configured to be mounted on a base. This solution facilitates mounting of the blind-mate connector 100 to the base.

In another embodiment, when the protrusion 52 is located on the fixing plate and the floating hole 51 is located on the floating support 1, the floating support 1 may include a connecting plate, and the floating hole 51 is located on the connecting plate. The auxiliary plate 6 is located on a side of the connecting plate away from the fixing plate, the auxiliary plate 6 includes a second mounting hole, and the screw 53 passes through the second mounting hole to fasten the auxiliary plate 6 and the fixing plate. In this embodiment, the auxiliary plate 6 is fastened relative to the fixing plate and does not move with the floating support 1. The connecting plate of the floating support 1 is located between the auxiliary plate 6 and the fixing plate, and this may also improve reliability of circumferentially floating the floating support 1, and make a fastened connection between floating support 1 and the fixing plate reliable in an axial direction.

In a specific embodiment, a diameter of the floating hole 51 and a diameter of the protrusion 52 may be determined based on a circumferential mounting tolerance of a to-be-cooled device in an insertion direction and a circumferential mounting tolerance of the blind-mate connector in the insertion direction. Specifically, a difference between the diameter of the floating hole 51 and the diameter of the protrusion 52 is less than or equal to 5 mm. In other words, a floating size of the floating support 1 and the fixing plate in a circumferential direction is less than or equal to 5 mm. A specific value of a sliding stroke is not limited in this application. For example, the sliding stroke of a connector 2 relative to the floating support 1 may be 0.5 mm, 1 mm, 1.2 mm, 1.5 mm, 1.8 mm, 2 mm, 2.5 mm, 3 mm, 3.3 mm, 3.5 mm, 3.7 mm, 4 mm, 4.5 mm, 4.9 mm, or the like. A floating distance of the blind-mate connector in a circumferential direction does not exceed 5 mm, and this can meet a tolerance requirement. In addition, if the diameter of the floating hole 51 differs greatly from the diameter of the protrusion 52, it is difficult to align the blind-mate connector with the to-be-cooled device, and an operation is complex.

In a specific embodiment, the blind-mate connector 100 includes at least two connectors 2, so that integrity of the blind-mate connector 100 is improved, thereby improving connection efficiency of the blind-mate connector 100.

Figure 6:
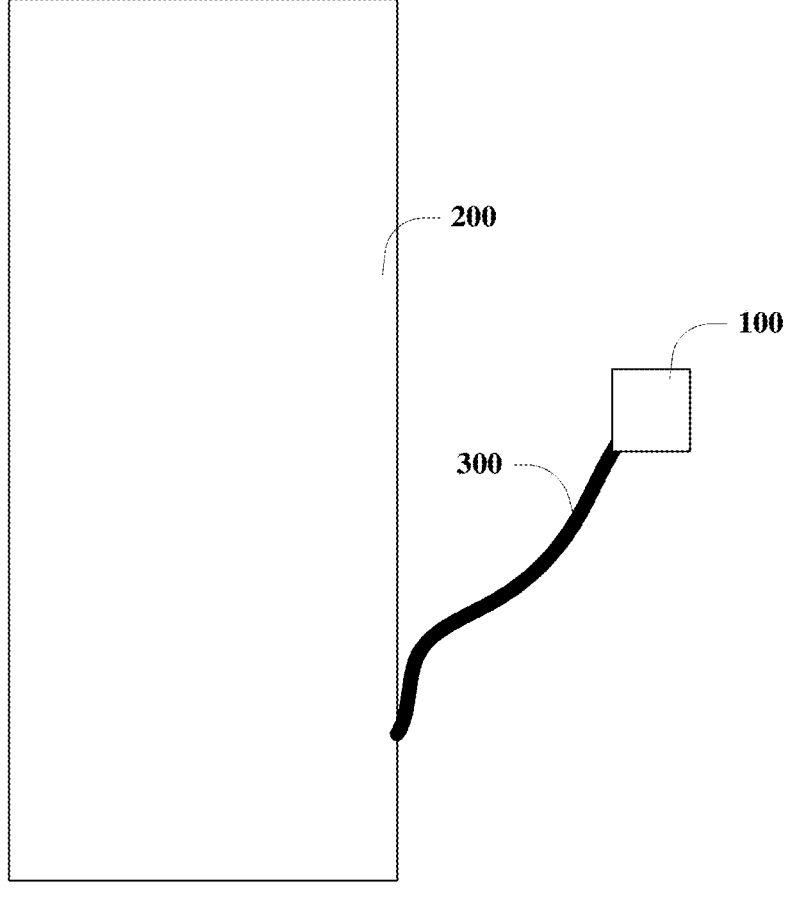
FIG. 6 is a diagram of a structure of a liquid cooling apparatus according to an embodiment of this application.

FIG. 6 is a diagram of a structure of a liquid cooling apparatus according to an embodiment of this application. As shown in FIG. 6, based on the same concept, this application further provides a liquid cooling apparatus. The liquid cooling apparatus includes the blind-mate connector 100 in the foregoing embodiments, and may further include a liquid storage cavity 200 and a pipe 300. The liquid storage cavity 200 may be specifically provided with a refrigerant liquid. One end of the pipe 300 is in communication with the liquid storage cavity 200, and the other end is in communication with the blind-mate connector 100, so that the refrigerant liquid in the liquid storage cavity 200 can flow to a to-be-cooled device through the pipe 300 and the blind-mate connector 100. The blind-mate connector 100 in this embodiment of this application is a floating connector, so that the blind-mate connector 100 can be easily inserted into the to-be-cooled device. The blind-mate connector 100 has a simple structure and low costs.

Specifically, the liquid storage cavity 200 may be a liquid storage cavity of a liquid cooling heat sink, a liquid storage cavity of a heat exchanger, or the like. This is not limited in this application.

In a possible implementation, this application further provides a system. The system includes a cabinet where an electronic device is placed and a liquid cooling apparatus. The liquid cooling apparatus is configured to dissipate heat for the electronic device or a specified component in the electronic device. For a structure of the liquid cooling apparatus, refer to the liquid cooling apparatus shown in FIG. 6. For brevity, details are not described herein again.

In a possible implementation, in addition to a scenario in which the liquid cooling apparatus provided in this application and the cabinet where the electronic device is placed are in different cabinets, the blind-mate connector is also applicable to a scenario in which the liquid cooling apparatus and the electronic device are in a same cabinet. A structure of the blind-mate connector is similar to the structure shown in FIG. 1 to FIG. 5. For brevity, details are not described herein again.

The foregoing descriptions are merely specific implementations of this application, but are not intended to limit the scope of the protection of this application. Any variation or replacement readily figured out by a person skilled in the art within the technical scope disclosed in this application shall fall within the scope of the protection of this application. Therefore, the scope of the protection of this application shall be subject to the scope of the protection of the claims.

What is claimed is:

1. A blind-mate connector, comprising:
a floating support;
a connector, comprising a plug-in end, wherein the plug-in end is configured to implement a connection between a liquid cooling apparatus and a to-be-cooled device, the connector is slidably assembled on the floating support, and a sliding direction of the connector is consistent with an insertion direction of the connector; and
a floating component, comprising a protrusion, wherein a diameter of a floating hole is larger than that of the protrusion, the protrusion is assembled in the floating hole, and the protrusion is circumferentially movable in the floating hole; and
wherein: the floating support is mounted on a fixing plate by using the floating component, the protrusion is located on the floating support, and the floating hole extends in the fixing plate.

2. The blind-mate connector according to claim 1, further comprising an elastic member, wherein the elastic member is mounted between the connector and the floating support, and the elastic member is configured to apply a reset force toward the to-be-cooled device in the insertion direction to the plug-in end.

3. The blind-mate connector according to claim 2, wherein the floating support defines an accommodating cavity, the connector is at least partially located in the accommodating cavity, the accommodating cavity is defined by a bottom wall and a side wall, and the elastic member is mounted between the bottom wall and the plug-in end.

4. The blind-mate connector according to claim 3, wherein the side wall comprises a limiting step, the connector has a first surface matching the limiting step, and the connector is configured in a manner that when the connector moves toward the bottom wall by a first preset distance, the first surface abuts against the step.

5. The blind-mate connector according to claim 3, wherein a stopper is detachably mounted in an opening of the accommodating cavity, the connector has a second surface matching the stopper, and the connector is configured in a manner that, when the connector moves away from the bottom wall by a second preset distance, the second surface abuts against the stopper.

6. The blind-mate connector according to claim 2, wherein the elastic member is a spring.

7. The blind-mate connector according to claim 1, wherein the floating component further comprises a screw, a thickness of the floating hole is smaller than a thickness of the protrusion, a screw hole is in the protrusion, and the screw is mounted in the screw hole in a manner that the protrusion is located in the floating hole.

8. The blind-mate connector according to claim 7, further comprising an auxiliary plate, wherein when the protrusion is located on the floating support and the floating hole extends in the fixing plate, the auxiliary plate is located on a side of the fixing plate that faces away from the floating support, a first mounting hole is in the auxiliary plate, and the screw passes through the first mounting hole to fasten the auxiliary plate and the floating support.

9. The blind-mate connector according to claim 1, wherein a difference between the diameter of the floating hole and the diameter of the protrusion is less than or equal to 5 mm.

10. The blind-mate connector according to claim 1, wherein a sliding stroke of the connector relative to the floating support is less than or equal to 5 mm.

11. The blind-mate connector according to claim 1, comprising at least two connectors.

12. A liquid cooling apparatus, comprising a blind-mate connector, a liquid storage cavity and a pipe, wherein a first end of the pipe is in communication with the liquid storage cavity, and a second end is in communication with the blind-mate connector, and wherein the blind-mate connector comprises:
a floating support;
a connector, comprising a plug-in end, wherein the plug-in end is configured to implement a connection between the liquid cooling apparatus and a to-be-cooled device, the connector is slidably assembled on the floating support, and a sliding direction of the connector is consistent with an insertion direction of the connector; and
a floating component, comprising a protrusion, wherein a diameter of a floating hole is larger than that of the protrusion, the protrusion is assembled in the floating hole, and the protrusion is circumferentially movable in the floating hole; and
wherein:
the floating support is mounted on a fixing plate by using the floating component, the protrusion is located on the floating support, and the floating hole extends in the fixing plate.

13. The liquid cooling apparatus according to claim 12, wherein the blind-mate connector further comprising an elastic member, wherein the elastic member is mounted between the connector and the floating support, and the elastic member is configured to apply a reset force toward the to-be-cooled device in the insertion direction to the plug-in end.

14. The liquid cooling apparatus according to claim 13, wherein the floating support defines an accommodating cavity, the connector is at least partially located in the accommodating cavity, the accommodating cavity is defined by a bottom wall and a side wall, and the elastic member is mounted between the bottom wall and the plug-in end.

15. The liquid cooling apparatus according to claim 14, wherein the side wall comprises a limiting step, the connector has a first surface matching the limiting step, and the connector is configured in a manner that when the connector moves toward the bottom wall by a first preset distance, the first surface abuts against the step.

16. The liquid cooling apparatus according to claim 14, wherein a stopper is detachably mounted in an opening of the accommodating cavity, the connector has a second surface matching the stopper, and the connector is configured in a manner that when the connector moves away from the bottom wall by a second preset distance, the second surface abuts against the stopper.

17. The liquid cooling apparatus according to claim 13, wherein the elastic member is a spring.

18. The liquid cooling apparatus according to claim 12, wherein the floating component further comprises a screw, a thickness of the floating hole is smaller than a thickness of the protrusion, a screw hole extends in, and the screw is mounted in the screw hole in a manner that the protrusion is located in the floating hole.

19. The liquid cooling apparatus according to claim 18, wherein the blind-mate connector further comprises an auxiliary plate, wherein when the protrusion is located on the floating support and the floating hole extends in the fixing plate, the auxiliary plate is located on a side of the fixing plate that faces away from the floating support, a first mounting hole extends in the auxiliary plate, and the screw passes through the first mounting hole to fasten the auxiliary plate and the floating support.

20. The liquid cooling apparatus according to claim 12, wherein a difference between the diameter of the floating hole and the diameter of the protrusion is less than or equal to 5 mm.

\* \* \* \* \*